(12) United States Patent
Tomikawa et al.

(10) Patent No.: US 6,723,484 B1
(45) Date of Patent: Apr. 20, 2004

(54) POSITIVE-WORKING PHOTOSENSITIVE RESIN PRECURSOR COMPOSITION

(75) Inventors: Masao Tomikawa, Shiga (JP); Naoyo Okamoto, Aichi (JP); Satoshi Yoshida, Shiga (JP); Ryoji Okuda, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 09/567,106

(22) Filed: May 8, 2000

Related U.S. Application Data

(63) Continuation of application No. PCT/JP99/04849, filed on Jul. 9, 1999.

(30) Foreign Application Priority Data

| Sep. 9, 1998 | (JP) | 10-255356 |
| Oct. 13, 1998 | (JP) | 10-290481 |
| Nov. 6, 1998 | (JP) | 10-315990 |

(51) Int. Cl.$^7$ .............................................. G03F 7/023
(52) U.S. Cl. ........................ 430/192; 430/191; 430/193; 430/270.1
(58) Field of Search ................................. 430/191, 192, 430/193, 270.1

(56) References Cited

U.S. PATENT DOCUMENTS

| 5,288,588 A | * | 2/1994 | Yukawa et al. | 430/192 |
| 5,302,489 A | * | 4/1994 | Shu | 430/191 |
| 5,342,739 A | * | 8/1994 | Katou et al. | 430/325 |
| 5,518,864 A | * | 5/1996 | Oba et al. | 430/325 |
| 5,753,407 A | * | 5/1998 | Oba | 430/170 |
| 6,232,032 B1 | * | 5/2001 | Nunomura et al. | 430/191 |

FOREIGN PATENT DOCUMENTS

| JP | 3-115461 | 5/1991 |
| JP | 10-186658 | 7/1998 |
| JP | 10-307394 | 11/1998 |
| JP | 11-100503 | 4/1999 |
| JP | 11-102068 | 4/1999 |
| JP | 11-106651 | 4/1999 |
| JP | 2000-075478 | 3/2000 |

* cited by examiner

*Primary Examiner*—John S. Chu
(74) *Attorney, Agent, or Firm*—Morrison & Foerster LLP

(57) ABSTRACT

The present invention relates to a positive-working photosensitive resin precursor composition which is characterized in that it contains (a) polymer in which the chief component comprises structural units of the kind where the bonding between structural units is represented by general formula (1) and (b) photoacid generator, and it can form a pattern by light irradiation and subsequent developing, and the total carboxyl groups contained in said polymer is from 0.02 to 2.0 mmol/g, and it provides a photosensitive resin composition of high sensitivity which can be developed by alkali.

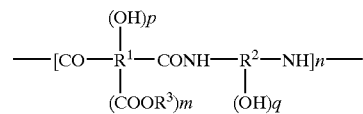

($R^1$ is an organic group of valency from 3 to 8 having at least 2 carbon atoms, $R^2$ is an organic group of valency from 2 to 6 having at least 2 carbon atoms, $R^3$ is hydrogen or an organic group with from 1 to 10 carbons. n is an integer of value from 3 to 100,000, m is 1 or 2, p and q are integers of value from 0 to 4 and p+q>0).

14 Claims, No Drawings

POSITIVE-WORKING PHOTOSENSITIVE RESIN PRECURSOR COMPOSITION

REFERENCE TO RELATED APPLICATION

This application is a continuation of International Application No. PCT/JP99/04849, filed Jul. 9, 1999.

TECHNICAL FIELD

The present invention relates to a photosensitive resin composition which can be used for the interlayer dielectrics of semiconductor devices and for buffer coat films, α-ray shielding films and the like, and which can form patterns by exposing to actinic radiation and dissolving away the exposed regions with aqueous alkali solution.

TECHNICAL BACKGROUND

Heat-resistant resins such as polyimides are employed in the semiconductor field to form interlayer dielectrics, buffer coat films, α-ray shielding films and the like. In using a polyimide in such applications, patterning of the polyimide film is necessary for the purpose of through hole formation and the like. For example, a solution of the polyamic acid, which is the polyimide precursor, is applied to the substrate, and then converted to the polyimide by heat treatment, after which a positive photoresist relief pattern is formed on the polyimide film and, with this as a mask, patterning is carried out by selective etching of the polyimide film by means of a hydrazine etching agent. However, this method has the problem that, as well as the process being complex since it includes the photoresist application and removal steps, etc, dimensional accuracy is lowered because of side etching. For such reasons, photosensitive resin compositions have been investigated which are heat-resistant resins, or precursors which can be converted to heat-resistant resins by means of a heat treatment or the like, and which themselves can undergo pattern processing.

For photosensitive resin compositions to have a pattern accuracy enabling them to be employed in passivation layer pattern formation, a method has been investigated whereby first of all patterning and curing of the photosensitive resin precursor composition is carried out on the passivation layer prior to pattern formation and then, with this pattern as a mask, dry etching of the underlying passivation layer is carried out (the one mask process). In accordance with this method, it is possible to shorten the process required in passivation layer pattern formation, leading to a reduction in costs.

When using a photosensitive resin composition, normally application and drying on the substrate are performed in the solution state, and irradiation with active light rays is performed through a mask. As negative-working photosensitive resin precursor compositions where the exposed regions are left following the developing, there are known compositions where a substance having carbon-carbon double bond which is demeriziable or polymerizable by actinic radiation and an amino group or quaternized salt thereof are added to a polyamic acid (JP-B-59-52822). compositions where an acrylamide is added to the polyamic acid (JP-A-3-170555) and compositions where a polyimide precursor with a carbon-carbon double bond, a specified oxime compound and a sensitising agent are incorporated (JP-A-61-118423). However, there is the problem that changing over from a conventional non photosensitive resin composition patterning process using a positive-working photoresist to a process using a negative-working photosensitive resin composition requires a change in the exposure device mask and a change in the developing equipment. Furthermore, these negative-working photosensitive resin compositions employ organic solvents in the developing, but from the point of view of preventing environmental pollution and improving the working environment, a photosensitive material which can be developed with an aqueous developer liquid instead of an organic developer liquid is desirable. For these reasons, alkali-developable positive-working photosensitive resin compositions are being investigated.

As known examples of positive-working photosensitive resin compositions where the exposed regions are dissolved away by developing with an aqueous alkali solution, there are the polyimide precursors where o-nitrobenzyl groups have been introduced by ester bonds (JP-A-60-37550), the composition where an o-quinone diazide compound is mixed into a polyamic acid ester (JP-A-2-181149), the composition where an o-quinone diazide compound is mixed with a polyamic acid or polyamic acid ester which has a phenolic hydroxyl group (JP-A-3-115461), the composition where an o-quinone diazlde compound is mixed with a polyimide which has a phenolic hydroxyl group (JP-3-177455), and the composition where an o-quinone diazide compound is mixed with a polyhydroxyamide (JP-B-1-46862).

However. the polyimide precursors with o-nitrobenzyl groups introduced by means of ester bonds have the problem that the sensitising wavelengths are mainly below 300 nm and the sensitivity is low. In the case where an o-quinone diazide compound is mixed into the polyamic acid ester, the rate of dissolution by the alkali developer is low, so the sensitivity is low and the developing time is lengthy. In the case where an o-quinone diazide compound is added to a polyamic acid with a phenolic hydroxyl group, the solubility in the alkali developer is too great, so there is the problem that only dilute developer liquid can be employed and, since the unexposed regions are swollen by the developer liquid, fine patterning is difficult. Where an o-quinone diazide compound is mixed with a or polyimide with a phenolic hydroxyl group, the dissolution rate in the alkali developer is improved but there is the problem that further adjustment of the dissolution rate is difficult Where an o-quinone diazide compound is mixed with a polyhydroxyamide, the dissolution rate in the alkali developer is improved but there is the problem that change to the polymer composition is required for further adjustment in the dissolution rate. The present invention has been made in view of these various problems of the prior art, and it has as its objective to offer a photosensitive resin composition where adjustment of the dissolution time in the aqueous alkali solution is possible and, furthermore, where the polymer transparency is high at the exposure wavelengths and which has high sensitivity.

DISCLOSURE OF THE INVENTION

The present invention is a positive-working photosensitive resin composition which is characterized in that it contains (a) polymer in which the chief component comprises structural units of the kind where the bonding between structural units is represented by general formula (1) and (b) photoacid generator, and which can form a pattern by light irradiation and subsequent developing, and the total carboxyl groups contained in 1 g of said polymer is from 0.02 to 2.0 mmol.

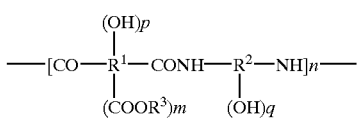
(1)

($R^1$ is an organic group of valency from 3 to 8 having at least 2 carbon atoms, $R^2$ is an organic group of valency from 2 to 6 having at least 2 carbon atoms, $R^3$ is hydrogen or an organic group with from 1 to 10 carbons but it is not all hydrogen. n is an integer of value from 3 to 100,000, m is 1 or 2, p and q are integers of value from 0 to 4 and p+q>0).

Optimum Form for Practising the Invention

In the present invention, the polymer represented by general formula (1) is preferably one which can form a polymer with imide rings, oxazole rings or other cyclic structures by heating or by means of a suitable catalyst. By forming cyclic structures, the heat resistance and solvent resistance are markedly enhanced. The polymer in which structural units represented by aforesaid general formula (1) are the chief component preferably has hydroxyl groups. In such circumstances, because of the presence of the hydroxyl groups, the solubility in aqueous alkali solution is better than that of a polyamic acid which does not have hydroxyl groups. In particular, from amongst hydroxyl groups, phenolic hydroxyl groups are preferred in terms of their solubility in aqueous alkali solution.

The residual group which constitutes $R^1$ in general formula (1) denotes an acid structural component, and this acid component is preferably a $C_2$ to $C_{60}$ trivalent to octavalent group containing an aromatic ring and having from one to four hydroxyl groups. Where $R^1$ does not contain hydroxyl groups, desirably the $R^2$ component contains from one to four hydroxyl groups. An example is shown by general formula (6).

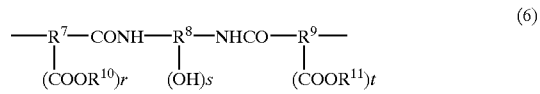
(6)

($R^7$ and $R^9$ represent $C_2$ to $C_{20}$ organic groups of valency 3 or 4, $R^8$ represents a hydroxyl group-containing $C_3$ to $C_{20}$ organic group of valency from 3 to 6, and $R^{10}$ and $R^{11}$ are each hydrogen or a $C_1$ to $C_{10}$ monovalent organic group. $R^{10}$ and $R^{11}$ are not all hydrogen atoms, nor are they all $C_1$ to $C_{10}$ monovalent organic groups. r and t represent the integers 1 or 2, and s denotes an integer of value from 1 to 4).

Furthermore, the hydroxyl groups are preferably in a position adjacent to an amide bond. As examples thereof, there are structures of the kind shown in (10) below, but the present invention is not restricted to these.

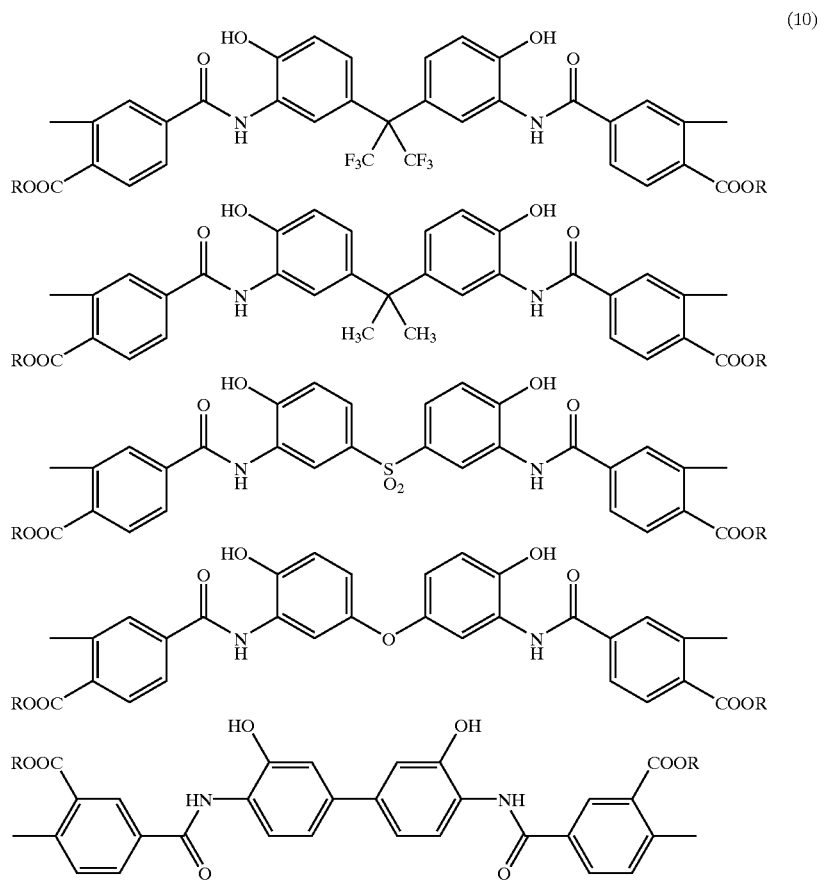
(10)

(R is a hydrogen atom or a $C_1$ to $C_{20}$ monovalent organic group)

Furthermore, for $R^1$, it is also possible to employ tetracarboxylic acids, tricarboxylic acids and dicarboxylic acids which do not contain hydroxyl groups. As examples thereof, there are aromatic tetracarboxylic acids such as pyromellitic acid, benzophenonetetracarboxylic acid, biphenyltetracarboxylic acid, diphenyl ether tetracarboxylic acid and diphenyl sulphone tetracarboxylic acid, and the diesters thereof where two of the carboxyl groups are converted to methyl ester or ethyl ester group form; aliphatic tetracarboxylic acids such as butane tetracarboxylic acid and cyclopentane tetracarboxylic acid, and the diesters thereof where two of the carboxyl groups are in the methyl or ethyl group form; and aromatic tricarboxylic acids such as trimellitic acid, trimesic acid, naphthalene tricarboxylic acid and the like.

The residual group which constitutes $R^2$ in general formula (1) denotes a diamine structural component. Preferred examples of $R^2$ are those with an aromatic ring, from the point of view of the heat resistance of the polymer obtained, and also having from one to four hydroxyl groups. Where $R^2$ does not have hydroxyl groups, it is desirable that the $R^1$ component contain from one to four hydroxyl groups. Furthermore, the hydroxyl groups are preferably positioned adjacent to an amide bond.

As specific examples, there are compounds such as bis(aminohydroxyphenyl)hexafluoropropane, diaminodihydroxypyrimidine, diaminodihydroxypyridine, hydroxydiaminopyrimidine, diaminophenol and diaminodihydroxybenzene, and those with the following residual structures.

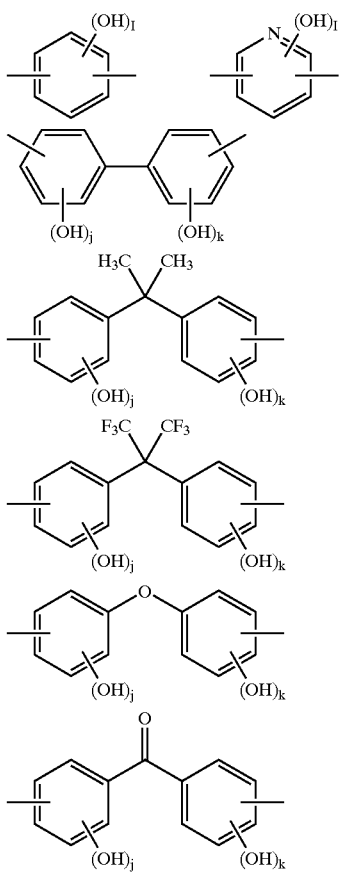

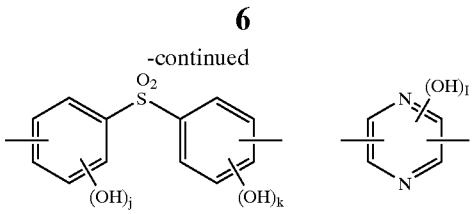

(i is an integer in the range 1 to 4, j and k are integers in the range 0 to 4, and j+k is at least 1).

Amongst these $R^2$ components, as further preferred examples there can be cited the compounds with the structures shown by general formulae (7), (8) and (9). Of these, specific examples of further preferred structures are exemplified by general formulae (11), (12) and (13).

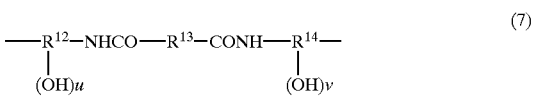
(7)

($R^{12}$ and $R^{14}$ represent hydroxyl group-containing $C_2$ to $C_{20}$ organic groups of valency 3 or 4, and $R^{13}$ represents a $C_2$ to $C_{30}$ divalent organic group. u and v represent the integers 1 or 2).

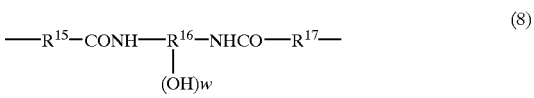
(8)

($R^{15}$ and $R^{17}$ represent $_2$ to $C_{30}$ divalent organic groups, and $R^{16}$ represents a hydroxyl group-containing $C_2$ to $C_{20}$ organic group of valency 3 to 6. w represents an integer in the range 1 to 4).

(9)

($R^{16}$ represents a $C_2$ to $C_{30}$ divalent organic group, and $R^{19}$ represents a hydroxyl group-containing $C_2$ to $C_{20}$ organic group of valency 3 to 6. x represents an integer in the range 1 to 4).

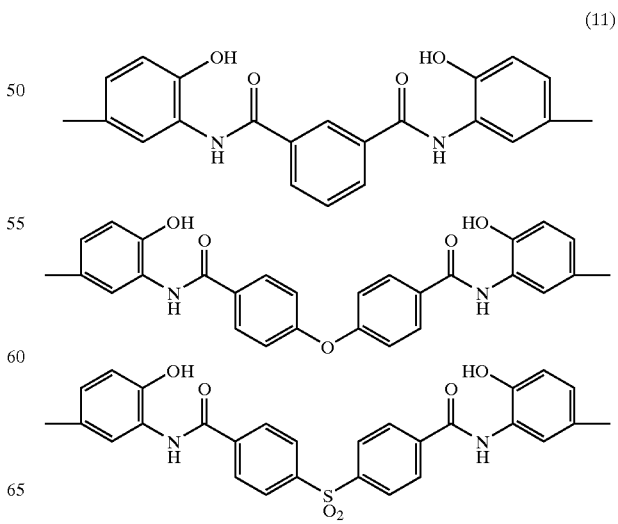
(11)

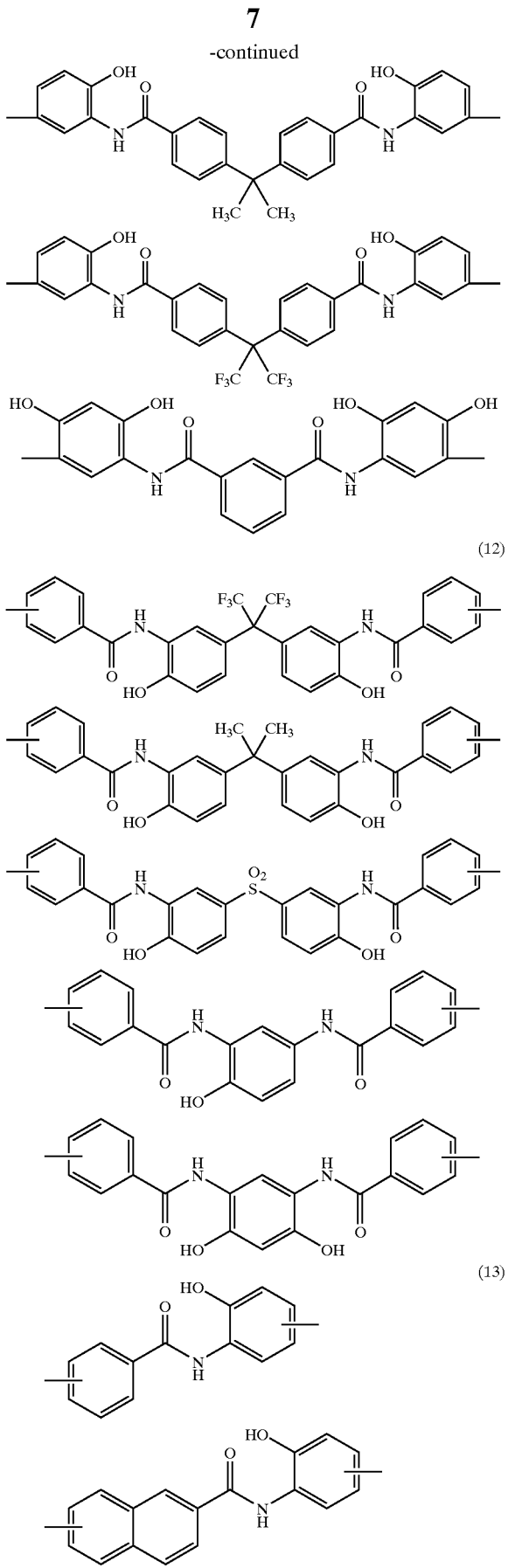

Furthermore, it is also possible to use a diamine which does not contain a hydroxyl group for the residual group containing $R^2$ in general formula (1). As examples thereof, there are phenylenediamine, diaminodiphenyl ether, aminophenoxybenzene, diaminodiphenylmethane, diamlinodiphenylsulphone, bis(trifluoromethyl)benzidine, bis(aminophenoxyphenyl)propane, bis(aminophenoxyphenyl)sulphone or compounds comprising these aromatic rings with alkyl group and/or halogen atom substituents, and aliphatic cyclohexyldiamine, methlylene biscyclohexylamine and the like. These diamine compounds can be used on their own or they can be used in combinations of two or more types. It is preferred that they be used as no more than 40 mol % of the diamine component. If more than 40 mol % is copolymerized then the heat resistance of the polymer obtained is lowered.

With the objective of improving the adhesion to the substrate, it is also possible to use a diamine compound with a siloxane structure within a range such that the heat resistance is not lowered. As examples of diamines with a siloxane structure, there may be used bis(3-aminopropyl) tetramethyldisiloxane, bis(3-aminopropyl) tetraphenyldisiloxane, bis(4-aminophenyl) tetramethyldisiloxane and the like.

$R^3$ in general formula (1) represents hydrogen or a $C_1$ to $C_{10}$ organic group. If the number of carbons in $R^3$ exceeds 20 then the solubility in aqueous alkali is lost. In terms of the stability of the photosensitive resin solution obtained, $R^3$ is preferably an organic group, but hydrogen is preferred in terms of the solubility in aqueous alkali. In other words, it is not desirable that $R^3$ all be hydrogen or that it all be an organic group. By adjusting the proportion of $R^3$ which comprises hydrogen or which comprises an organic group, the dissolution rate in aqueous alkali solution may be varied, so by such adjustment it is possible to obtain a photosensitive resin composition with a suitable dissolution rate. Thus, the carboxyl group content of the polymer is preferably from 0.02 mmol to 2.0 mmol per 1 g of polymer. More preferably, it is from 0.05 mmol to 1.5 mmol. If there is less than 0.02 mmol, then the solubility in the developer liquid is too low, while if there is more than 2.0 mmol then it is not possible to realise a difference in dissolution rate between the exposed and unexposed regions. m represents 1 or 2, and p and q are each integers in the range 0 to 4, with p+q>0. If p is 5 or more, then the properties of the heat-resistant resin film obtained are impaired.

Again, it is possible to control the amount of residual carboxyl groups by imidization of some of the carboxyl groups. As the method of imidization, any known imidization method can be used. The proportion of the imidization at this time is preferably from 1% to 50%. If the percentage imidization exceeds 50%, then the absorption by the polymer of the actinic radiation used for exposure is increased and the sensitivity decreased.

The polymer represented by general formula (1) is preferably as transparent as possible in terms of the actinic radiation used for exposure. Hence, the absorbance of the polymer at 365 nm is preferably no more than 0.1 per 1 µm of film thickness. More preferably, it is no more than 0.08. If it is more than 0.1, then the sensitivity in terms of exposure to 365 nm actinic radiation is lowered.

The positive-working photosensitive resin of the present invention may only comprise structural units represented by general formula (1), or it may comprise a copolymer with other structural units or a blend. In such circumstances, the content of the structural units represented by general formula (1) is preferably at least 90 mol %. The type and amount of structural units employed for copolymerisation or blending are preferably selected from within a range such that the heat resistance of the polyimide polymer obtained by the final heat treatment is not impaired. Generally speaking, the polymer represented by general formula (1) can be obtained by treating the carboxyl groups in a polymer represented by general formula (2) by means of a compound represented by general formula (3), (4) or (5).

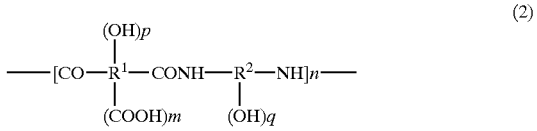

($R^1$ is 3-valent to 8-valent organic group with at least 2 carbons, and $R^2$ is a 2-valent to 6-valent organic group with at least two carbon atoms. n is an integer in the range 3 to 100,000, m is 1 or 2, p and q are each integers in the range 0 to 4 and p+q>0.

The polymer chiefly comprising structural units represented by general formula (2) in the present invention is synthesized by known methods. For example, it can be synthesized by the method of reacting a tetracarboxylic dianhydride and a diamine compound at low temperature (C. E. Sroog et al, J. Polymer Science, Part A-3, 1373 (1965)).

In general formula (3), $R^4$ and $R^5$ represent a hydrogen atom or a monovalent organic group, nitrogen-containing organic group or oxygen-containing organic group with at least one carbon. $R^4$ and $R^5$ may be the same or different. $R^6$ represents a monovalent organic group with at least one carbon.

$R^6$ in general formula (3) or in general formula (4) represents a monovalent organic group with at least one carbon and $R^7$ represents a divalent organic group, nitrogen-containing organic group or oxygen-containing organic group with at least one carbon. Specifically, in the case of the compounds represented by general formula (3), examples are N,N-dimethylformamide dimethyl acetal, N,N-dimethylformamide diethyl acetal, N,N-dimethylformamide dipropyl acetal, N,N-dimethylformamide dibutyl acetal, N,N-dimethylformamide dibenzyl acetal, N,N-dimethylformamide bis[2-(trimethylsilyl)ethyl]acetal, N,N-dimethylacetamide diethyl acetal, trimethyl orthoformate, triethyl orthoformate, trimethyl orthoacetate, triethyl orthoacetate, trimethyl orthobutyrate, triethyl orthobutyrate, trimethyl orthobenzoate, triethyl orthobenzoate, 1,3-dimethylimidazolidinone dialkyl acetal, ethylene carbonate dialkyl acetal, propylene carbonate dialkyl acetal and the like, with N,N-dimethylformamide dimethyl acetal, N,N-dimethylformamide diethyl acetal, N,N-dimethylformamide dipropyl acetal, N,N-dimethylformamide dibutyl acetal and N,N-dimethylformamide dibenzyl acetal preferred.

As examples of the compounds represented by general formula (4), $R^7$ represents a divalent organic group which forms a ring. Preferred examples of the compounds represented by general formula (4) are N-methylpyrrolidone dimethyl acetal, N-methylpyrrolidone diethyl acetal N-methylpyrrolidone dipropyl acetal, N-methylpyrrolidone dibutyl acetal, γ-butyrolactone dimethyl acetal, γ-butyrolactone diethyl acetal and the like. As specific examples of the compounds represented by general formula (5), there are methyl vinyl ether, ethyl vinyl ether, n-propyl vinyl ether, isopropyl vinyl ether, n-butyl vinyl ether, isobutyl vinyl ether. tert-butyl vinyl ether, cyclohexyl vinyl ether and the like, but there is no restriction to these. Preferably. tert-butyl vinyl ether, cyclohexyl vinyl ether and isopropyl vinyl ether are used.

At the time of the esterification treatment of the polymer represented by general formula (2) by means of general formula (3), general formula (4) or general formula (5), imidization may also take place as a side reaction but the proportion of imidization in terms of the esterification reaction can be suppressed by selection of the reaction conditions, namely by selection of the reaction solvent and the reaction temperature, etc.

As the reaction solvent, there is preferably used N-methyl-2-pyrrolidone (NMP), N,N-dimethylformamide, N,N-dimethylacetamide, dimethylsulphoxide, 1,3-dimethylimidazolidinone, hexamethylphosphoramide, γ-butyrolactone or other such non-protic polar solvent, with N-methyl-2-pyrrolidone, N,N-dimethylformamide and N,N-dimethylacetamide more preferred. As solvents other than these, there can be used, in total or in part, ketone solvents such as acetone or methyl ethyl ketone, alcohol solvents such as methanol or ethanol, or ester solvents such as propylene glycol monomethyl ether acetate, ethyl lactate or the like. The esterification reaction temperature lies in the range from 0° C. to 150° C., preferably 20° C. to 100° C. and more preferably 3° C. to 80° C. If the reaction temperature is less than 0° C., then the time for the reaction to reach completion is prolonged and so this becomes impractical. Furthermore, when the reaction temperature exceeds 150° C., problems readily arise such as the extent of imidization increasing, the polymer transparency falling and a gel component being produced. In the treatment by means of a compound represented by general formulae (3) or (4) it is possible, for the purpose of accelerating the reaction, to employ from 0.01 to 10 mol % of an acid such as trifluoroacetic acid, p-toluenesulphonic acid or methanesulphonic acid, or of a base such as triethylamine, pyridine or the like.

At the time of the reaction between the polymer represented by general formula (2) and a compound represented by general formula (3), (4) or (5), there may also be added an acid compound as a catalyst for accelerating the reaction. With regard to the amount of such acid compound added, for the purposes of selectively accelerating the reaction there can be used from 0.01 to 10 mol % in terms of the carboxyl groups. As specific examples of the acid catalyst there are hydrochloric acid, sulphuric acid, nitric acid, phosphoric acid, oxalic acid and the like, but there is no restriction to these. Preferably, there is used high pKa value phosphoric acid or oxalic acid. This is thought to be because the higher the pKa value of the acid catalyst the greater the nucleophilic character of the counter anion produced, and cationic polymerisation is suppressed.

The amount of the compound represented by general formula (3), (4) or (5) added can be determined from the concentration of the carboxyl groups in the polymer represented by general formula (2).

The compounds represented by general formulae (3), (4) and (5) may be used on their own or they may be used as mixtures of a plurality thereof.

As an alternative thereto for esterification of the carboxyl groups, it is possible to use the method of converting the carboxylic acid to the metal salt and subjecting this to the action of an alkyl halide, the method of using diazomethane, or the reaction based on dialkyl sulphate, etc.

The preferred reaction solvent is N-methyl-2-pyrrolidone (NMP), N,N-dimethylformamide, N,N-dimethylacetamide, dimethylsulphoxide, 1,3-dimethylimidazolidinone, hexamethylphosphoramide, γ-butyrolactone or other such non-protic polar solvent, with N-methyl-2-pyrrolidone, N,N-dimethylformamide and N,N-dimethylacetamide further preferred. The reaction temperature lies in the range from −10° C. to 150° C., preferably 0° C. to 80° C. and more preferably 10° C. to 60° C. If the reaction temperature is below −10° C., the time for the reaction to reach completion is prolonged and so it becomes impractical. Again, if the reaction temperature exceeds 150° C., problems arise due to reactions such as imidization, a reduction in the polymer transparency, the formation of a gel component and a lowering of the cured film properties.

Treatment of the polymer represented by general formula (2) by the compounds represented by general formulae (3), (4) or (5) is carried out by mixing and stirring general formula (3), (4) or (5) and, optionally, an acid catalyst, with a solution of general formula (2) dissolved in an organic solvent. In the case where the solvent used at the time of the synthesis of the polymer represented by general formula (2) and the solvent used when treating the polymer with general formula (3) and the acid catalyst compound are the same, then said treatment can be carried out by mixing and stirring the compound of general formula (3), (4) or (5) with the solution obtained following polymerisation.

As examples of the photoacid generator employed in the present invention, there are compounds which are decomposed and generate acid by irradiation such as diazonium salts, diazoquinone sulphonamides, diazoquinone sulphonic acid esters, diazoguinone sulphonates, nitrobenzyl esters, onium salts, halides, halogenated isocyanates, triazine halides, bisarylsulphonyldiazomethanes, disulphones and the like. In particular, o-quinone diazide compounds are preferred since they have the effect of suppressing the water solubility of the unexposed regions. Such compounds include 1,2-benzoquinone-2-diazido-4-sulphonate ester or sulphonamide, 1,2-naphthoquinone-2-diazido-5-sulphonate ester or sulphonamide, 1,2-naphthoquinone-2-diazido-4-sulphonate ester or sulphonamide, and the like. These can be obtained for example by a condensation reaction between an o-quinonediazide sulphonyl chloride such as 1,2-benzoquinone-2-azido-4-sulphonyl chloride, 1,2-naphthoquinone-2-diazido-5-sulphonyl chloride or 1,2-naphthoquinone-2-diazido-4-sulphonyl chloride, and a polyhydroxy compound or polyamine compound in the presence of a dehydrochlorination catalyst.

As examples of the polyhydroxy compound, there are hydroquinone, resorcinol, pyrogallol, bisphenol A, bis(4-hydroxyphenyl)methane, 2,2-bis(4-hydroxyphenyl) hexafluoropropane, 2,3,4-trihydroxybenzophenone, 2,3,4,4'-tetrahydroxybenzophenone, 2,2',4,4'-tetrahydroxy-benzophenone, tris(4-hydroxyphenyl)methane, 1,1,1-tris(4-hydroxyphenyl)ethane, 1-[1-(4-hydroxyphenyl)isopropyl]-4-[1,1-bis(4-hydroxyphenyl)ethyl]benzene, methyl gallate, ethyl gallate and the like.

As examples of the polyamine compounds there are 1,4-phenylenediamine, 1,3-phenylenediamine, 4,4'-diaminodiphenyl ether, 4,4'-diaminodiphenylmethane, 4,4'-diaminodiphenylsulphone, 4,4'-diaminodiphenylsulphide and the like.

As polyhydroxypolyamine compounds, there are 2,2-bis (3-amino-4-hydroxyphenyl)hexafluoropropane, 3,3'-dihydroxybenzidine and the like.

Preferably from 5 to 100 parts by weight, and more preferably from 10 to 40 parts by weight, of the o-quinone diazide compound is mixed per 100 parts by weight of the polymer represented by general formula (1). With less than 5 parts by weight, insufficient sensitivity is obtained, while with more than 100 parts by weight there is the possibility that the heat resistance of the resin composition will be lowered.

The positive-working photosensitive resin composition of the present invention is preferably employed in the solution state by dissolving the polymer represented by general formula (1), which is obtained by treating polymer represented by general formula (2) with a compound represented by general formula (3), (4) or (5), in a solvent along with the photoacid generator As the solvent, non-protic polar solvents such as N-methyl-2-pyrrolidone, N,N-dimethylformamide, N,N-dimethylacetamide, dimethylsulphoxide, 1,3-dimethylimidazolidinone, hexamethylphosphoramide and γ-butyrolactone may be used on their own, or in combinations of two or more thereof, but other solvents can also be used providing that they will dissolve the polymer represented by general formula (1) and the photosensitizer.

Again, where required, with the objective of enhancing the application properties between the photosensitive precursor composition and the substrate, there may also be mixed therein surfactants, esters such as ethyl lactate and propylene glycol monomethyl ether acetate, alcohols such as ethanol, ketones such as cyclohexanone and methyl isobutyl ketone, and ethers such as tetrahydrofuran and dioxane Again, it is possible to add inorganic particles such as silicon dioxide and titanium dioxide, or polyimide powder, etc.

Furthermore, in order to enhance the adhesion to an underlying substrate such as a silicon wafer, it is possible to add from 0.5 to 10 parts by weight of a silane coupling agent, titanium chelating agent or the like to the photosensitive resin composition varnish, or the underlying substrate may be pretreated with such a chemical.

When added to the varnish, from 0.5 to 10 parts by weight of the silane coupling agent, such as methyl methacryloxy-dimethoxysilane or 3-aminopropyltrimethoxysilane, or of the titanium chelating agent or aluminium chelating agent is added in terms of the polymer in the varnish.

When treating the substrate, a solution obtained by dissolving 0.5 to 20 parts by weight of the aforesaid coupling agent in a solvent such as isopropanol, ethanol, methanol, water, tetrahydrofuran, propylene glycol monomethyl ether acetate, propylene glycol monomethyl ether, ethyl lactate, diethyl adipate or the like is used to treat the surface by spin coating, immersion, spray application or vapour treatment, etc. Depending on the circumstances, by subsequent application of temperature in the range 50° C. to 300° C., reaction between the substrate and the coupling agent is promoted.

Next, explanation is provided of the method of forming a heat-resistant resin pattern using the photosensitive resin composition of the present invention.

The photosensitive resin composition of the present invention is applied onto the substrate. As the substrate, there may be used a silicon wafer, a ceramic, gallium arsenide or the like, but there is no restriction to these. The application method may be rotary application using a spinner, spray application, roll coating or the like. Furthermore, the applied film thickness will differ with the application means, the solids content of the composition and the viscosity, etc, but normally application is performed such that the film thickness after drying is from 0.1 to 150 μm.

Next, the photosensitive resin composition coating is obtained by drying the substrate on which the photosensitive resin composition has been applied. The drying is preferably carried out using an oven, hot plate or infrared radiation, etc, for from 1 minute to several hours within the range 50° C. to 150° C.

Subsequently, this coating is irradiated with actinic radiation through a mask with the desired pattern, and exposure effected. Examples of the actinic radiation employed for the exposure are ultraviolet light, visible light, an electron beam, X-rays and the like, but it is preferred in the present invention that there be used the mercury lamp i-line (365 nm), h-line (405 nm) or g-line (436 nm).

To form the heat-resistant resin pattern, the exposed regions are eliminated using a developer liquid following the exposure. Preferred examples of the developer liquid are aqueous tetramethylammonium hydroxide solutions, and aqueous solutions of compounds which exhibit alkalinity such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dlmethylaminoethyl methacrylate, cyclohexylamine, ethylenediamine, hexamethylenediamine and the like. Further, depending on the circumstances, there may be added to such aqueous alkali solutions a non-protic polar solvent such as N-methyl-2-pyrrolidone, N,N-dimethylformamide, N,N-dimethylacetamide, dimethylsulphoxide, γ-butyrolactone or dimethylacrylamide, an alcohol such as methanol, ethanol or isopropanol, an ester such as ethyl lactate or propylene glycol monomethyl ether acetate, a ketone such as cyclopentanone, cyclohexanone, isobutyl ketone or methyl isobutyl ketone, or a combination of more than one such solvent. After developing, a rinsing treatment is carried out with water. The rinsing treatment may also be carried out with the addition, to the water, of an alcohol such as ethanol or isopropyl alcohol, ester such as ethyl lactate or propylene glycol monomethyl ether acetate, or carbon dioxide, hydrochloric acid, acetic acid or other such acid.

Following the developing, by application of a temperature of from 200° C. to 500° C. conversion is effected to the heat-resistant resin coating. This heat treatment is carried out for from 5 minutes to 5 hours either by selection of temperatures and raising the temperature in stepwise fashion, or by selecting a temperature range and continuously raising the temperature. As an example, heat treatment is carried out for 30-minute periods at 130° C., 200° C. and 350° C. Alternatively, there is the method of linearly increasing the temperature over two hours from room temperature to 400° C.

The heat-resistant resin coating formed by means of the photosensitive resin composition of the present invention may be used in applications such as semiconductor passivation layers, semiconductor device protective films and the interlayer dielectrics of multilayer interconnects for high density mounting, etc.

EXAMPLES

Below, in order to explain the present invention in more detail, examples are provided, but the invention is not to be restricted to these examples.

Methods of Measuring the Properties

Measurement of Film Thickness

Using a Lambda-Ace STM-602 manufactured by the Dainippon Screen Manufacturing Co., measurements were carried out at a refractive index of 1.64. In this way, taking the film thickness prior to development as T1 and the film thickness of the unexposed regions after development as T2, if T2/T1×100 was 70% or less, or if the extent of thickness loss in the development was 2 μm or more, then the level of thickness loss by the developing was large, which is undesirable. More preferably, T2/T1×100 was at least 80%.

Furthermore, at the same time, the exposure level required for all the film to be dissolved by the developer was measured. Where this value was greater that 500 mJ/cm$^2$, the sensitivity was low and so this is undesirable.

Measurement of the Light Absorbance

The polymer solution is coated onto a 5 cm×5 cm glass base plate of 1.2 mm thickness (#7059, manufactured by Matsunami Glass), and pre-baked for 3 minutes at 120° C. Using a Shimadzu Corporation UV-240, and with an identical glass plate which had not been coated with polymer solution as a reference, the absorbance of the coated film at 365 nm was measured, and by dividing by the actual film thickness the absorbance per 1 μm of film thickness was determined.

Measurement of the Percentage Imidization

The polymer solution was coated onto a 4-inch silicon wafer to give a film thickness following prebaking of about 7 μm, and then prebaking was carried out for 3 minutes at 120° C. Firstly, background measurement was carried out using as a reference a 4-inch silicon wafer, on which no polymer solution had been applied, set on the hot plate. Next, the infrared absorption spectrum of the film was measured using an FT-720 manufactured by Horiba Ltd. Subsequently. using an inert oven, INH-21CD made by the Koyo Lindberg Co., heat treatment was carried out for 30 minutes at 200° C., after which the temperature was increased to 350° C. over 1 hour and heat treatment conducted for 1 hour at 350° C., so that complete imidization was performed. The infrared absorption spectrum of this sample was then measured, and the percentage imidization was determined from the ratio of the C-N stretching vibration peak (1380 cm$^{-1}$) due to the imide bonds before and after the imidization treatment.

That is to say, taking the peak value at 1380 cm$^{-1}$ prior to the treatment at 350° C. as A, and that following the sample treatment at 350° C. as B, the percentage imidizatlon I is expressed by the following relation.

$$I = A/B \times 100$$

Quantitative Determination of the Carboxyl Groups in the Polymer

About 100 ml of the polymer solution was added dropwise to 5 liters of pure water, and the polymer precipitated. This was dried under reduced pressure for 48 hours in a vacuum drier at 80° C. 0.5 g of the dry polymer was dissolved in 40 ml of N-methyl-2-pyrrolidone (NMP) and 10 ml of methanol, and the content of the free carboxyl groups in the polymer determined by titration with a 1/10 N methanol solution of tetrabutylammonium hydroxide using a model F702 manufactured by Shibata Kagaku Kikai Kogyo. With regard to the carboxyl groups per 1 g of polymer, taking the amount of the 1/10 N tetrabutylammonium hydroxide solution in methanol required for neutralization in this titration as x ml, the molar quantity of tetrabutylammonium hydroxide required for the neutralization is x/10 mmol. Since this molar quantity is equal to the amount of carboxyl groups per 0.5 g of polymer, the carboxyl groups per 1 g of polymer is obtained by dividing by 0.5. In other words, it is x/5 (mmol).

Resolution

A prebaked film formed on a silicon wafer was exposed through a mask having various widths. When developing was carried out, the minimum width where the pattern in the exposed region completely dissolved following development was taken as the resolution. Thus, the narrower this width, the finer the pattern that can be obtained, and the better the assessed resolution.

Measurement of Residual Quantities of Sodium, Potassium and Iron Ions

A solution obtained by weighing out 2 g of dried sample and dissolving with 25 ml of NMP was measured using a Z8000 Zeerman Atomic Absorption Spectrometer manufactured by Hitachi Ltd. The calibration of concentration was performed using solutions of standard concentrations of the respective ions. If the amount of these metal ions is 10 ppm or more, there is a fear of corrosion when used as a coating agent, so this will be a problem.

Measurement of the Residual Chlorine Ion Concentration 100 mg of dried sample was weighed out and dispersed in 20 ml of water, then ultrasonics applied for 2 hours using an ultrasonic cleaning device (B20H manufactured by BRANSON) and the chlorine ions extracted. Using an Ion Meter N-8M manufactured by Horiba Ltd, the concentration of chlorine ions was measured with a chlorine ion electrode (8002 manufactured by Horiba Ltd). The calibration of the chlorine ion concentration was carried out using calcium chloride aqueous solutions of known concentration. If the chlorine ion concentration is 30 ppm or above, then there is a fear of corrosion when used as a coating agent or the like, so this is a problem.

Synthesis Example 1

Synthesis of an Acid Anhydride Containing Hydroxyl Groups 18.3 g (0.05 mol) of 2,2-bis(3-amino-4-hydroxyphenyl) hexafluoropropane (BAHF) and 34.2 g (0.3 mol) of allyl glycidyl ether were dissolved in 100 g of gamma-butyrolactone (GBL) under a current of dry nitrogen, and cooled to −15° C. To this, there was added dropwise 22.1 g (0.11 mol) of trimellitic anhydride chloride dissolved in 50 g of GBL, in such a way that the temperature of the reaction liquid did not exceed 0° C. Following the end of the dropwise addition, reaction was carried out for 4 hours at 0° C.

The solution was concentrated using a rotary evaporator, poured into 1 liter of toluene and the anhydride obtained. This is shown below. The material obtained did not show a clear melting point up to 350° C.

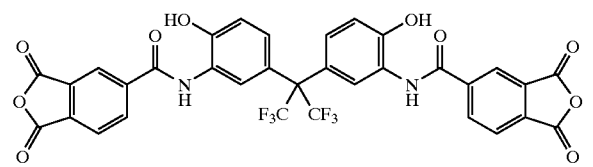

Synthesis Example 2

Synthesis of Hydroxyl Group-containing Diamine Compound (1)

18.3 g (0.05 mol) of BAHF was dissolved in 100 ml of acetone and 17.4 g (0.3 mol) of propylene oxide, and cooled to −15° C. A solution of 20.4 g (0.11 mol) of 3-nitrobenzoyl chloride dissolved in 100 ml of acetone was added dropwise thereto. Following the completion of the dropwise addition, reaction was carried out for 4 hours at −15° C., after which the solution was returned to room temperature. It was then concentrated using a rotary evaporator and the solid obtained recrystallized using a solution of tetrahydrofuran and ethanol.

The solid collected from the recrystallization was dissolved in 100 ml of ethanol and 300 ml of tetrahydrofuran, then 2 g of 5% palladium-carbon added and vigorous stirring carried out. Hydrogen was introduced into this with a balloon, and a reduction reaction carried out at room temperature. After about 2 hours, when it was confirmed that the balloon did not deflate any more, the reaction was halted. Following the end of the reaction, filtering was performed and the palladium compound catalyst eliminated. By concentration using the rotary evaporator, the diamine compound was obtained. This is shown below. The solid obtained was used for reaction as it was. When the melting point was measured using a Shimadzu Differential Scanning Calorimeter DSC-50 at a heating rate of 10° C./min, it was found to be 318° C.

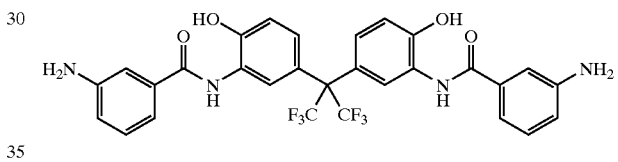

Synthesis Example 3

Synthesis of Hydroxyl Group-containing Diamine (2)

30.8 g (0.2 mol) of 2-amino-4-nitrophenol was dissolved in 200 ml of acetone and 60 g (0.68 mol) of propylene oxide, and cooled to −15° C. A solution of 22.4 g (0.11 mol) of isophthaloyl chloride in 200 ml of acetone was slowly added dropwise thereto. Following the completion of the dropwise addition, reaction was carried out for 4 hours at −15° C. Subsequently, the solution was returned to room temperature and the precipitate produced was collected by filtering.

30 g of the dried precipitate and 3 g of 5% palladium-carbon were added along with 400 ml of Methyl Cellosolve to a 500 ml autoclave. Pressure was applied with hydrogen so that the internal pressure was 8 kgf/cm², and stirring carried out for 2 hours at 80° C. Subsequently, when the temperature of the solution had fallen to 50° C. or less, the pressure was released, then filtering carried out and the precipitate removed. The filtrate was concentrated with a rotary evaporator and the solid produced was collected. This was dried for 20 hours in a vacuum drier at 50° C. The structure of this material is shown below.

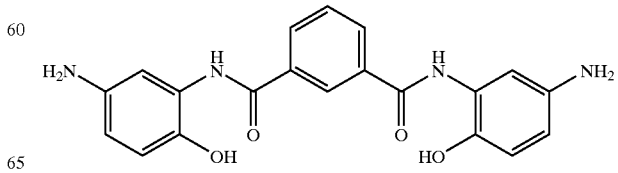

Synthesis Example 4

Synthesis of Hydroxyl Group-containing Diamine (3)

15.4 g (0.1 mol) of 2-amino-4-nitrophenol was dissolved in 80 ml of acetone and 30 g (0.34 mol) of propylene oxide, and cooled to −15° C. A solution of 19.5 g (0.105 mol) of 3-nitrobenzoyl chloride in 80 ml of acetone was slowly added dropwise thereto. Following the completion of the dropwise addition, reaction was carried out for 4 hours at −15° C. Subsequently, the solution was returned to room temperature and the precipitate produced was collected by filtering.

25 g of the dried solid and 2 g of 5% palladium-carbon were added to a 500 ml autoclave along with 300 ml of Methyl Cellosolve. Thereafter, the target precipitate was obtained in the same way as in Synthesis Example 3. This was dried for 20 hours in a vacuum drier at 50° C. The structure is shown below.

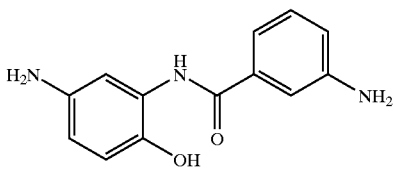

Synthesis Example 5

Synthesis of a Naphthoquinone Diazide Compound 20.2 g (0.05 mol) of 1,1,2-tri(3,5-dimethyl-4-hydroxyphenyl)propane and 40.3 g (0.15 mol) of 5-naphthoquinonediazidesulphonyl chloride were dissolved in 400 g of 1,4-dioxane under a current of dry nitrogen, and the solution heated to 40° C. To this, there was added dropwise 15.2 g (0.15 mol) of triethylamine mixed with 40 g of 1,4-dioxane, in such a way that the internal temperature of the system did not rise above 45° C. Following the dropwise addition, stirring was carried out for 2 hours at 40° C. The by-product triethylamine hydrochloride was filtered off, and the filtrate poured into 3 liters of 1% hydrochloric acid. Subsequently, the precipitate which had been deposited was collected by filtering. This precipitate was washed twice with 10 liters of water, then dried for 20 hours in a vacuum drier at 50° C., and the naphthoquinone diazide compound obtained. The structure of the compound is shown below.

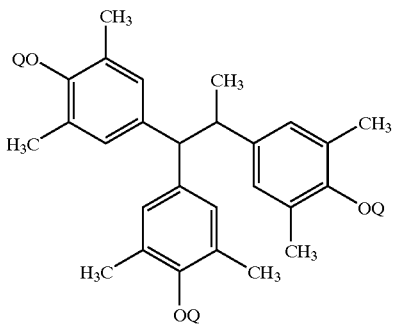

-continued

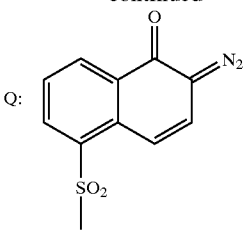

Example 1

20.0 g (100 mmol) of 4,4'-diaminodiphenyl ether dissolved in 350 g of N-methyl-2-pyrrolidone (NMP) in a 1-liter four-necked flask under a current of dry nitrogen. To this, there was added 71.4 g (100 mmol) of the acid anhydride synthesized in Synthesis Example 1, along with 40 g of GBL, and reaction carried out for 1 hour at 20° C., followed by 4 hours reaction at 50° C. Furthermore, 23.8 g (200 mmol) of N,N-dimethylformamide dimethyl acetal was added, and stirring carried out for 5 hours at 50° C. A solution of partially esterified polymer was obtained. The carboxyl content of 1 g of this polymer was 0.07 mmol, the percentage imidization was 10% and the absorbance at 365 nm was 0.083 per 1 $\mu$m.

5.5 g of the quinone diazide compound 4NT-300 (the ester obtained by the reaction of 3 mol of 1,2-naphthoquinone-2-diazido-5-sulphonyl chloride with 1 mol of 2,3,4,4'-tetrahydroxybenzophenone: produced by Toyo Gosei Kogyo K.K.) was added to 100 g of the solution obtained, and a photosensitive resin composition solution obtained.

This solution was applied onto a 6-inch silicon wafer, to give a film thickness after prebaking of 7 $\mu$m, and then using a hot plate (SKW-636 manufactured by the Dainippon Screen Mfg. Co.), prebaking was carried out for 3 minutes at 120° C. and a photosensitive heat-resistant resin precursor film obtained. Next, a reticule on which a pattern had been cut was set in an exposure means (i-line stepper NSR-1755-i7A produced by the Nikon Corp.) and i-line exposure carried out at exposures ranging from 100 mJ/cm$^2$ to 800 mJ/cm$^2$ in 50 mJ/cm$^2$ intervals. Subsequently, 100 seconds immersion was carried out in NMD-3 (2.38% aqueous solution of tetramethylammonium hydroxide: produced by the Tokyo Ohka Kogyo Co.), and then washing with water performed for a further 20 seconds, to form the pattern.

The film thickness in the unexposed regions following developing was 5.6 $\mu$m, so that the thickness loss by the developing was 1.4 $\mu$m. As shown in Table 1, furthermore, the minimum irradiation level at the time of pattern formation was low, at 300 mJ/cm$^2$, and so the sensitivity was good. Moreover, when the pattern profile was observed by electron microscopy, there was good 5 $\mu$m line and space resolution.

Example 2

24.2 g (40 mmol) of the hydroxyl group-containing diamine compound (1) synthesized in Synthesis Example 2 was dissolved in 100 g of NMP in a 1-liter four-necked flask under a current of dry nitrogen, then 11.8 g (40 mmol) of 3,3',4,4'-biphenyltetracarboxylic dianhydride added and stirring carried out for 3 hours at 80° C. Furthermore, 8.8 g (60 mmol) of N,N-dimethylformamide diethyl acetal was added, stirring carried out for 3 hours at 80° C., and a solution of partially esterified polymer obtained. The carboxyl group content per 1 g of this polymer was 0.55 mmol, the percentage imidization was 35% and the absorbance at 365 nm was 0.066 per 1 $\mu$m.

100 g of this polymer solution and 3.5 g of the quinone diazide compound 4NT-300 used in Example 1 were mixed together and a photosensitive resin composition solution obtained.

Evaluation was carried out in the same way as in Example 1, except that the developing time was 50 seconds. The results are shown in Table 1. The film thickness of the unexposed regions following developing was 5.8 µn, so the level of thickness loss due to the developing was low, at 1.2 µm. Moreover, the light irradiation level at the time of pattern formation was 250 mJ/cm$^2$, indicating high sensitivity. Furthermore, when the pattern profile was observed by electron microscopy, there was good 10 µm line resolution.

Example 3

Polymerization was carried out in the same way as in Example 1, except that the diamine composition was 18.3 g (50 mmol) of 2,2-bis(3-amino-4-hydroxyphenyl) hexafluoropropane (BAHF). 8.0 g (40 mmol) of 4,4'-diaminodiphenyl ether and 2.5 g (10 mmol) of 1,3-bis(3-aminopropyl)tetramethyldisiloxane. The carboxyl group content in 1 g of this polymer was 0.35 mmol, the percentage imidization was 14% and the absorbance was 0.045 per 1 µm. 30 g of this polymer was dissolved in 70 g of GBL, and by dissolving 6 g of the quinone diazide compound 4NT-300 employed in Example 1 there was obtained the photosensitive resin composition solution.

Evaluation was carried out in the same way as in Example 1. The results are shown in Table 1. The film thickness of the unexposed regions following developing was 6.0 µm and so the thickness loss due to developing was low, at 1.0 µm. Moreover, the light irradiation level at the time of pattern formation was 250 mJ/cm$^2$, indicating high sensitivity. Furthermore, when the pattern profile was observed by electron microscopy, there was good 10 µm line and space resolution.

Example 4

Reaction was carried out up to prior to the action of the N,N-dlmethylformamide dimethyl acetal using an identical composition to that in Example 1, and polymerisation performed. Subsequently, 22.4 g (200 mmol) of potassium t-butoxide was added and stirring carried out for 2 hours, after which 34.3 g (220 mmol) of ethyl iodide was added dropwise. After two hours, the polymer solution was poured into pure water so that the polymer precipitated, following which it was dried. The carboxyl group content in 1 g of this polymer was 1.2 mmol, the percentage imidization was 20% and the absorbance at 365 nm was 0.088 per 1 µm. 30 g of this polymer was dissolved in 70 g of GBL, and by dissolving 6 g of the quinone diazide compound 4NT-300 employed in Example 1 there was obtained the photosensitive resin composition solution.

Evaluation was carried out in the same way as in Example 1. The results are shown in Table 1. The film thickness of the unexposed regions following developing was 5.5 µm and so the thickness loss by developing was 1.5 µm. Moreover, the light irradiation level at the time of pattern formation was 300 mJ/cm$^2$, indicating high sensitivity. Furthermore, when the pattern profile was observed by electron microscopy, there was excellent 10 µm line and space resolution.

Example 5

An identical composition to that employed in Example 1, except that there was used 29.45 g (200 mmol) of N-methyl-2-pyrrolidone diethyl acetal instead of the N,N-dimethylformamide dimethyl acetal, was stirred for 5 hours at 50° C. and a solution of partially esterified polymer obtained. The carboxyl group content in 1 g of this polymer was 0.28 mmol, the percentage imidization was 8% and the absorbance at 365 nm was 0.082 per 1 µm. A photosensitive solution was prepared in the same way as in Example 1 using this polymer.

Evaluation was carried out in the same way as in Example 1. The results are shown in Table 1. The film thickness of the unexposed regions following developing was 5.5 µm and so the thickness loss due to the developing was 1.5 µm. Moreover, the light irradiation level at the time of pattern formation was 300 mJ/cm$^2$. Furthermore, when the pattern profile was observed by electron microscopy, there was good 5 µm line and space resolution.

Example 6

13.6 g (36 mmol) of the hydroxyl group-containing diamine compound (2) synthesized in Synthesis Example 3 and 0.99 g (4 mmol) of 1,3-bis(3-aminopropyl) tetramethyldisiloxane were dissolved in 100 g of NMP in a 1-liter four-necked flask under a current of dry nitrogen, then 12.4 g (40 mmol) of 3,3',4,4'-diphenyl ether tetracarboxylic dianhydride added and stirring carried out for 3 hours at 80° C. Furthermore, 9.5 g (80 mmol) of N,N-dimethylformamide diethyl acetal was added and stirring carried out for 3 hours at 80° C. Subsequently, 5 g (83 mmol) of acetic acid was added and the residual acetal compound decomposed. A solution of partially esterified polymer was obtained. This polymer solution was poured into 5 liters of water, and the polymer precipitate collected by filtration. This polymer was dried for 20 hours in a vacuum drier at 80° C. The carboxyl group content of 1 g of this polymer was 0.12 mmol, the percentage imidization was 12% and the absorbance at 365 nm was 0.066 per 1 µm.

10 g of this polymer and 2 g of the naphthoquinone diazide compound synthesized in Synthesis Example 5 were mixed with 5 g of NMP and 25 9 of GBL, and the photosensitive resin composition solution obtained.

Evaluation was carried out in the same way as in Example 1 except that the developing time was 70 seconds. The results are shown in Table 1. The film thickness of the unexposed regions following developing was 5.5 µm and so the thickness loss due to the developing was 1.5 µm. Moreover, the light irradiation level at the time of pattern formation was 250 mJ/cm$^2$. Furthermore, when the pattern profile was observed by electron microscopy, there was good 10 µm line resolution.

Example 7

8.75 g (36 mmol) of the hydroxyl group-containing diamine compound (3) synthesized in Synthesis Example 2 and 0.99 g (4 mmol) of 1,3-bis(3-aminopropyl) tetramethyldisiloxane were dissolved in 100 g of NMP in a 1-liter four-necked flask under a current of dry nitrogen, then 12.9 g (40 mmol) of 3,3',4,4'-benzophenonetetracarboxylic dianhydride added and stirring carried out for 3 hours at 50° C. Furthermore, 10.7 g (90 mmol) of N,N-dimethylformamide dimethyl acetal was added and stirring carried out for 2 hours at 50° C. A solution of partially esterified polymer was obtained. The carboxyl group content of 1 g of this polymer was 0.08 mmol, the percentage imidization was 11% and the absorbance at 365 nm was 0.086 per 1 µm.

100 g of this polymer solution was mixed with 3.5 g of the quinone diazide compound 4NT-300 employed in Example 1 and the photosensitive resin composition solution obtained.

Evaluation was carried out in the same way as in Example 1 except that the developing time was 90 seconds. The results are shown in Table 1. The film thickness of the unexposed regions following developing was 5.8 μm and so the film loss due to the developing was low, at 1.2 μm. Moreover, the light irradiation level at the time of pattern formation was 450 mJ/cm². Furthermore, when the pattern profile was observed by electron microscopy, there was good 10 μm line resolution.

Comparative Example 1

A photosensitive resin precursor solution was obtained In the same way as in Example 1 except that no N,N-dimethyl formamide dimethyl acetal was added. The carboxyl group content of the polymer was 2.3 mmol, the percentage imidization was 7% and the absorbance at 365 nm was 0.083 per 1 μm.

Evaluation was carried out in the same way as in Example 1. but all the film dissolved.

Comparative Example 2

50 g of pyromellitic dianhydride and 300 ml of ethanol were introduced into a 500 ml flask, and 0.2 ml of pyridine added and stirring carried out for 10 hours at 30° C. under a nitrogen atmosphere. The excess ethanol was distilled off under reduced pressure and by drying the residue under vacuum the diethyl ester of pyromellitic acid was obtained.

31.4 g (100 mmol) of the diethyl ester of pyromellitic acid thus obtained and 100 ml of thionyl chloride were introduced into a flask and stirred for 1 hour at room temperature, after which refluxing was performed for 3 hours. The excess thionyl chloride was eliminated by means of an aspirator and the acid chloride obtained.

The acid chloride obtained was dissolved in 60 g of GBL and added dropwise to a solution of 36.62 g (100 mmol) of BAHF and 50 ml of pyridine dissolved in 200 ml of NMP, with said solution being maintained at 0° C. After continuing to stir for 10 hours at 0° C., stirring was carried out for a further 3 hours at 30° C. The insoluble material was then filtered off, following which the filtrate was poured into 5 liters of water and the polymer precipitated. The carboxyl group content of 1 g of this polymer was 0 mmol, the percentage imidization was 4% and the absorbance at 365 nm was 0.072 per 1 μm. Furthermore, the residual chlorine ion concentration of this polymer was high, at 100 ppm, which is a problem in terms of its use in semiconductor applications. The residual sodium, potassium and iron ions were all no more than 10 μm.

20 g of the polyamic acid diethyl ester obtained was dissolved in 60 g of GBL, and by dissolving 5 g of the quinone diazide compound 4NT-300 used in Example 1, the photosensitive resin composition solution was obtained.

Evaluation was carried out in the same way as in Example 1, but even when immersed for over 5 minutes in the developer liquid the exposed regions did not completely dissolve. The film thickness of the region exposed at 500 mJ/cmm2 was 5.1 μm and the film thickness of the unexposed regions remained the same at 7 μm.

Comparative Example 3

A photosensitive resin precursor solution was obtained in the same way as in Example 1 except that the polymerisation and the esterification reaction were carried out at 180° C. The carboxyl group content of 1 g of this polymer was 0.01 mmol, the percentage imidization was 6.5% and the absorbance at 365 nm was 0.113 per 1 μm.

Evaluation was carried out in the same way as in Example 1. As a result, the film thickness of the unexposed regions following developing was 5.5 μm and so the thickness loss due to the developing was 1.5 μm, but the light irradiation level required at the time of pattern formation was at least 750 mJ/cm², so the sensitivity was extremely poor.

Example 8

20.0 g (100 mmol) of 4,4'-diaminodiphenyl ether was dissolved in 350 g of NMP in a 1-liter four-necked flask under a current of dry nitrogen. To this, 71.4 g (100 mmol) of the acid anhydride synthesized in Synthesis Example 1 was added along with 40 g of GBL, and reaction carried out for 1 hour at 20° C., followed by 4 hours at 50° C. After cooling to 20° C., 24.0 g (240 mmol) of tert-butyl vinyl ether was added and stirring carried out for 24 hours at 20° C. A solution of partially esterified polymer was obtained. The carboxyl group content of 1 g of this polymer was 0.18 mmol, the percentage imidization was 20% and the absorbance at 365 nm was 0.084 per 1 μm.

5.5 g of 4NT-300 was added to 100 g of the solution obtained and the photosensitive resin composition solution obtained.

Evaluation was carried out in the same way as in Example 1 except that the developing time was 60 seconds. As a result, the film thickness of the unexposed regions following developing was 5.6 μm and so the thickness loss due to the developing was low, at 1.4 μm. Furthermore, the minimum light irradiation level at the time of pattern formation was low, at 350 mJ/cm², so the sensitivity was good. Moreover, when the pattern profile was observed by means of an electron microscope, there was good 10 μm line and space resolution.

Example 9

24.2 g (40 mmol) of the diamine compound synthesized in Synthesis Example 2 was dissolved in 100 g of NMP in a 1-liter four necked flask under a current of dry nitrogen, then 11.8 g (40 mmol) of 3,3',4,4'-biphenyltetracarboxylic dianhydride added and stirring carried out for 3 hours at 80° C. Furthermore, 9.2 g (72 mmol) of cyclohexyl vinyl ether was added and stirring carried out for 24 hours at 20° C. A solution of partially esterified polymer was obtained. The carboxyl group content of 1 g of this polymer was 0.40 mmol, the percentage imidization was 36% and the absorbance at 365 nm was 0.065 per 1 μm. Furthermore, the residual sodium, potassium and iron concentrations in this polymer were good values of no more than 10 ppm. Again, the residual chlorine concentration was a good value of no more than 10 ppm.

100 g of this polymer solution and 3.5 g of the quinone diazide compound 4NT-300 employed in Example 1 were mixed together and the photosensitive resin composition solution obtained.

Evaluation was carried out in the same way as in Example 1 except that the developing time was 50 seconds. As a result, the film thickness of the unexposed regions following developing was 5.7 μm and so the thickness loss due to the developing was low, at 1.3 μm. Furthermore, the light irradiation level at the time of pattern formation was 400 mJ/cm². Moreover, when the pattern profile was observed by means of an electron microscope, there was good 5 μm line resolution.

Example 10

Polymerization was carried out in the same way as in Example 1 except that the diamine composition was 18.3 g (50 mmol) of 2,2-bis(3-amino-4-hydroxyphenyl) hexafluoropropane (BAHF), 8.0 g (40 mmol) of 4.4'-diaminodiphenyl ether and 2.5 g (10 mmol) of 1,3-bis(3-aminopropyl)tetramethyldisiloxane. The carboxyl group content of 1 g of this polymer was 0.21 mmol, the percentage imidization was 20% and the absorbance at 365 nm was 0.056 per 1 μm. 30 g of this polymer was dissolved in 70 g of GBL, and by dissolving 6 g of the quinone diazide compound 4NT-300 employed in Example 1 there was obtained the photosensitive resin composition solution.

Evaluation was carried out in the same way as in Example 1. As a result, the film thickness of the unexposed regions following developing was 6.0 μm and so the film loss due to developing was low, at 1.0 μm. Furthermore, the value of the light irradiation level at the time of pattern formation was 350 mJ/cm², so there was high sensitivity. Moreover, when the pattern profile was observed by means of an electron microscope, there was excellent 10 μm line and space resolution.

Example 11

Using a composition identical to that in Example 1, reaction was carried out up to prior to the action of the N,N-dimethylformamide dimethyl acetal, and polymer produced. Subsequently, after cooling to 20° C., 24.0 g (240 mmol) of tert-butyl vinyl ether was added and 0.72 g (5.52 mmol) of phosphoric acid added dropwise. After stirring for 24 hours at 20° C., the polymer solution was poured into pure water and the polymer precipitated, following which it was dried for 24 hours in a vacuum drier at 80° C. The carboxyl group content of 1 g of this polymer was 0.08 mmol, the percentage imidization was 10% and the absorbance at 365 nm was 0.042 per 1 μm. 30 g of this polymer was dissolved in 70 g of GBL, and by dissolving 6 g of the quinone diazide compound 4NT-300 employed in Example 1, there was obtained the photosensitive resin composition solution.

Evaluation was carried out in the same way as in Example 1. As a result, the film thickness of the unexposed regions following developing was 6.4 Am and so the thickness loss due to the developing was low, at 0.6 μm. Furthermore, the light irradiation level at the time of pattern formation was 250 mJ/cm², so there was high sensitivity. Moreover, when the pattern profile was observed by means of an electron microscope, there was excellent 5 μm line and space resolution.

Example 12

With a composition identical to that in Example 1, reaction was carried out up to prior to the action of the N,N-dimethylformamide dimethyl acetal, and polymer produced. Subsequently, 20.9 g (240 mmol) of isopropyl vinyl ether was added and then 0.72 g (5.52 mmol) of phosphoric acid added dropwise. Stirring was carried out for 20 hours at 25° C., and a solution of partially esterified polymer obtained. The carboxyl group content of 1 g of this polymer was 0.12 mmol, the percentage imidization was 12% and the absorbance at 365 nm was 0.083 per 1 μm.

Evaluation was carried out in the same way as in Example 1. As a result, the film thickness of the unexposed regions following developing was 6.2 μm and so the thickness loss due to the developing was low, at 0.8 μm. Furthermore, the light irradiation level at the time of pattern formation was 300 mJ/cm². Moreover, when the pattern profile was observed by means of an electron microscope, there was good 5 μm line and space resolution.

Example 13

18.9 g (50 mmol) of the hydroxyl group-containing diamine (2) synthesized in Synthesis Example 3, 16.5 g (45 mmol) of BAHF and 1.24 g (5 mmol) of the 1,3-bis(3-aminopropyl)tetramethyldisiloxane were dissolved in 250 g of NMP and adjusted to 30° C. To this solution, there was added 31.0 g (100 mmol) of 3,3',4,4'-diphenyl ether tetracarboxylic dianhydride together with 50 g of NMP, and stirring carried out for 1 hour at 30° C and then for 2 hours at 50° C. Subsequently, with the solution temperature maintained at 50° C., there was added a solution of 23.8 9 (200 mmol) of N,N-dimethylformamide dimethyl acetal diluted with 80 g of NMP, and the stirring continued for two hours at 50° C. Thereafter, the temperature of the solution was adjusted to 30° C., and 60 g (1 mol) of acetic acid added along with 80 g of NMP. Stirring was carried out for 1 hour at 30° C. and the excess acetal compound decomposed. Following the end of the reaction, the polymer solution was poured into 10 liters of water and a precipitate of the polymer obtained. This was collected by filtering and dried for 24 hours in a ventilated oven at 80° C. The residual sodium, potassium and iron ion concentrations in the polymer were good, at no more than 10 ppm. Furthermore, the residual chlorine concentration was also good, at no more than 10 ppm.

The carboxyl group content of 1 g of this polymer was 0.43 mmol, the percentage imidization was 11% and the absorbance at 365 nm was 0.075 per 1 μm. 10 g of this polymer was dissolved in 70 g of NMP, and by dissolving 2 g of a sensitising agent (MG-300, produced by the Toyo Gosei Co.) formed by the reaction of 3 mol of 5-naphthoquinonediazide sulphonyl chloride with 1 mol of methyl gallate, there was obtained a photosensitive resin composition solution.

Evaluation was carried out in the same way as in Example 1 except that the developing time was 70 seconds. The results are shown in Table 1. As a result, the film thickness of the unexposed regions following developing was 5.8 μm and so the thickness loss due to the developing was low, at 1.2 μm. Furthermore, the light irradiation level at the time of pattern formation was 350 mJ/cm², so the sensitivity was high. Moreover, when the pattern profile was observed by means of an electron microscope, there was good 10 μm line and space resolution.

Example 14

12.2 g (50 mmol) of the hydroxyl group-containing diamine (3) synthesized in Synthesis Example 4, 16.5 g (45 mmol) of BAHF and 1.24 g (5 mmol) of 1,3-bis(3-aminopropyl)tetramethyldisiloxane were dissolved in 180 g of NMP, and the solution adjusted to 30° C. To this solution, 31.0 g (100 mmol) of 3,3',4,4'-diphenyl ether tetracarboxylic dianhydride was added along with 50 g of NMP, and stirring carried out for 1 hour at 30° C. and then for 2 hours at 50° C. Subsequently, with the solution temperature held at 50° C. a solution of 23.8 g (200 mmol) of N,N-dimethylformamide dimethyl acetal dissolved in 80 g of NMP was added and stirring continued for 2 hours at 50° C. Subsequently, the solution temperature was lowered to 30° C., 24 g (400 mmol) of acetic arid together with 30 g of NMP added, and stirring carried out for 1 hour at 30° C., so that the excess acetal compound was decomposed. Following the end of the reaction, the polymer solution was poured into 10 liters of water and a precipitate of polymer obtained. This was collected by filtering and drying carried out for 24 hours in a ventilated oven at 80° C. The residual sodium, potassium and iron concentrations of this polymer were good values of no more than 10 ppm. Moreover, the residual chlorine concentration was also good, at no more than 10 ppm.

The carboxyl group content of 1 g of this polymer was 0.44 mmol, the percentage imidization was 11% and the absorbance at 365 nm was 0.055 per 1 μm. 30 g of this polymer was dissolved in 70 g of NMP, and by dissolving 6 g of the naphthoquinone diazide compound MG-300, there was obtained the photosensitive resin composition solution.

Evaluation was carried out in the same way as in Example 1 except that the developing time was 60 seconds. The results are shown in Table 1. As a result, the film thickness of the unexposed regions following developing was 6.0 μm and so the thickness loss due to the developing was low, at 1.0 μm. Furthermore, the light irradiation level at the time of pattern formation was 350 mJ/cm$^2$, so the sensitivity was high. Moreover, when the pattern profile was observed by means of an electron microscope, there was good 10 μm line and space resolution.

Examples 15 to 17

57.4 g (95 mmol) of the hydroxyl group-containing diamine (1) synthesized in Synthesis Example 2 and 1.24 g (5 mmol) of 1,3-bis(3-aminopropyl)tetramethyldisiloxane were dissolved in 180 9 of NMP and the solution adjusted to 30° C. To this, there was added 31.0 g (100 mmol) of 3,3',4,4'diphenyl ether tetracarboxylic dianhydride together with 30 g of NMP, and stirring carried out for 1 hour at 30° C., followed by 2 hours at 50° C. Subsequently, with the solution temperature maintained at 50° C., the specified amount of N,N-dimethylformamide dimethyl acetal shown below was added along with 100 g of NMP (Example 15: 20.2 g (170 mmol), Example 16: 22.6 g (190 mmol) and Example 17: 25.0 g (210 mmol)). Thereafter, stirring was continued for 2 hours at 50° C. Subsequently, the temperature of the solution was made 30° C., 24 g (400 mmol) of acetic acid added and stirring carried out for 1 hour at 30° C., to decompose the excess acetal compound. Following the end of the reaction, the polymer solution was poured Into 10 liters of water and a precipitate of polymer obtained. This was collected by filtering and dried for 24 hours in a ventilated oven at 80° C. The residual sodium, potassium and iron concentrations of the polymer obtained in each case were good values of no more than 10 ppm. Furthermore, the residual chlorine concentration was also good, at no more than 10 ppm.

In Example 15, the carboxyl group content of 1 g of the polymer was 0.60 mmol, the percentage imidization was 9% and the absorbance at 365 nm was 0.044 per 1 μm; in Example 16 the carboxyl group content of 1 g of the polymer was 0.47 mmol, the percentage imidization was 8% and the absorbance at 365 nm was 0. 044 per 1 μm: and in Example 17 the carboxyl group content of 1 g of the polymer was 0.41 mmol, the percentage imidization was 10% and the absorbance at 365 nm was 0.045 per 1 μm. 30 g quantities of these polymer were respectively dissolved in 35 g of GBL and 35 g of NMP, and by dissolving 6 g of the naphthoquinone diazide compound synthesized in Synthesis Example 5, there were obtained photosensitive resin composition solutions.

Evaluation was carried out in the same way as in Example 1 except that the developing time was made 50 seconds (Example 15), 70 seconds (Example 16) or 90 seconds (Example 17). The results are shown in Table 1. In each case, the thickness loss due to the developing was good, at no more than 1.2 μm. Furthermore, the light irradiation level at the time of pattern formation was from 250 mJ/cm$^2$ to 300 mJ/cm$^2$, so the sensitivity was high. Moreover, when the pattern profile was observed by means of an electron microscope, there was excellent 5 μm line and space resolution.

Industrial Application Potential

In accordance with the present invention it is possible to adjust the dissolution rate in terms of aqueous alkali solution and, moreover, it is possible to obtain a photosensitive resin composition of high transparency at the exposure wavelength and high sensitivity.

TABLE 1

| | Photosensitive Resin Composition | | | | | | | Properties | | |
| --- | --- | --- | --- | --- | --- | --- | --- | --- | --- | --- |
| | Composition | | | | | | | | Minimum | |
| | Component R1 (mol ratio) | Component R2 (mol ratio) | Esterifying Agent (mol ratio) | Esterification Reaction Conditions, etc | Carboxyl Groups (mmol/g) | Percentage Imidization (%) | Absorbance | Remaining Film (%) | Irradiation Level (mJ/cm$^2$) | Resolution (μm) |
| Example 1 | Synthesis Example 1 (100) | DDE (100) | DMFDMA (200) | 50° C. 5 hours | 0.07 | 10 | 0.083 | 80 | 300 | 5 |
| Example 2 | HPDA (100) | Synthesis Example 2 (100) | DMFDEA (150) | 80° C. 3 hours | 0.55 | 35 | 0.066 | 83 | 250 | 10 |
| Example 3 | Synthesis Example 1 (100) | BAHF/DDE/SiDA (50/40/10) | DMFDMA (200) | 50° C. 5 hours | 0.35 | 14 | 0.045 | 86 | 250 | 10 |
| Example 4 | Synthesis Example 1 (100) | DDE (100) | t-BuOK (200) | 30° C. | 1.2 | 20 | 0.088 | 79 | 300 | 10 |
| Example 5 | Synthesis Example 1 (100) | DDE (100) | NMPDMA (200) | 50° C. 5 hours | 0.28 | 8 | 0.082 | 79 | 300 | 5 |
| Example 6 | DEDA (100) | Synthesis Example 3/SiDA (90/10) | DMFDEA (200) | 80° C. 3 hours | 0.12 | 12 | 0.066 | 79 | 250 | 10 |

TABLE 1-continued

| | Photosensitive Resin Composition | | | | | | | Properties | | |
|---|---|---|---|---|---|---|---|---|---|---|
| | Composition | | | | | | | | Minimum | |
| | Component R1 (mol ratio) | Component R2 (mol ratio) | Esterifying Agent (mol ratio) | Esterification Reaction Conditions, etc | Carboxyl Groups (mmol/g) | Percentage Imidization (%) | Absorbance | Remaining Film (%) | Irradiation Level (mJ/cm$^2$) | Resolution (μm) |
| Example 7 | BTDA (100) | Synthesis Example 2/SiDA (90/10) | DMFDEA (225) | 50° C. 2 hours | 0.08 | 11 | 0.066 | 83 | 450 | 10 |
| Example 8 | Synthesis Example 1 (100) | DDE (100) | TBVA (240) | 20° C. 24 hours | 0.18 | 20 | 0.084 | 80 | 350 | 10 |
| Example 9 | BPDA (100) | Synthesis Example 2 (100) | CHVE (180) | 20° C. 24 hours | 0.40 | 36 | 0.065 | 81 | 400 | 5 |
| Example 10 | Synthesis Example 1 (100) | BAHF/DDE/SiDA (50/40/10) | DMFDMA (200) | 50° C. 5 hours | 0.21 | 20 | 0.056 | 86 | 350 | 10 |
| Example 11 | Synthesis Example 1 (100) | DDE (100) | TBVA (240) | 20° C. 24 hours | 0.08 | 10 | 0.042 | 93 | 250 | 5 |
| Example 12 | Synthesis Example 1 (100) | DDE (100) | IPVE (240) | 25° C. 20 hours | 0.12 | 12 | 0.083 | 81 | 300 | 5 |
| Example 13 | DEDA (100) | Synthesis Example 3/ BAHF/SiDA (50/45/5) | DMFDEA (200) | 50° C. 2 hours | 0.43 | 11 | 0.075 | 83 | 350 | 10 |
| Example 14 | DEDA (100) | Synthesis Example 4/ BAHF/SiDA (50/45/5) | DMFDEA (200) | 50° C. 2 hours | 0.44 | 11 | 0.055 | 86 | 350 | 10 |
| Example 15 | DEDA (100) | Synthesis Example 2/SiDA (95/5) | DMFDMA (170) | 50° C. 2 hours | 0.60 | 9 | 0.044 | 86 | 250 | 5 |
| Example 16 | DEDA (100) | Synthesis Example 2/SiDA (95/5) | DMFDMA (190) | 50° C. 2 hours | 0.47 | 8 | 0.044 | 86 | 250 | 5 |
| Example 17 | DEDA (100) | Synthesis Example 2/SiDA (95/5) | DMFDMA (210) | 50° C. 2 hours | 0.41 | 10 | 0.045 | 90 | 300 | 5 |
| Comp. Ex. 1 | Synthesis Example 1 (100) | DDE (100) | none | none | 2.3 | 7 | 0.083 | all dissolves | — | — |
| Comp. Ex. 2 | PMDA (100) | BAHF (100) | ethanol (large excess) | 30° C. 10 hours | 0 | 4 | 0.072 | insoluble | — | — |
| Comp. Ex. 3 | Synthesis Example 1 (100) | DDE (100) | DMFDMA (200) | 180° C. 5 hours | 0.01 | 6.5 | 0.113 | 79 | 750 | 10 |

DDE: 4,4'-diaminodiphenyl ether
DMFDMA: N,N'-dimethylformamide dimethyl acetal
BPDA: 3,3',4,4'-biphenyltetracarboxylic dianhydride
DMFDEA: N,N-dimethylformamide diethyl acetal
BAHF: 1,3-bis(3-amino-4-hydroxyphenyl)hexafluoropropane
SiDA: 1,3-bis(3-aminopropyl)tetramethyldisiloxane
NMPDMA: N-methyl-2-pyrrolidone diethyl acetal
BTDA: 3,3',4,4'-benzophenonetetracarboxylic dianhydride
TBVE: tert-butyl vinyl ether
IPVE: isopropyl vinyl ether
DEDA: 3,3',4,4'-diphenyl ether tetracarboxylic dianhydride
PMDA: pyromellitic anhydride
t-BuOK: potassium t-butoxide

What is claimed is:

1. A positive-working photosensitive resin precursor composition comprising a polymer having structural units denoted by general formula (1) and a photoacid generator,

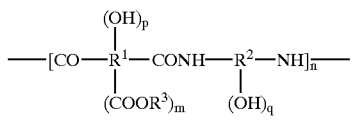

(1)

wherein $R^1$ is an organic group of the valency from 3 to 8 having at least 2 carbon atoms, $R^2$ is an organic group of the valency from 2 to 6 having at least 2 carbon atoms, and the hydroxyl group and the amide group are bonded to adjacent carbon atoms of $R^2$ or $R^2$ is an organic group of valency from 2 to 6 having at least 2 carbon atoms, and the hydroxyl group and the amide group bonded to $R^2$ are in positions capable of forming an oxazole ring, $R^3$ is selected from the group consisting of a single hydrogen atom and a monovalent organic group with from 1 to 10 carbon atoms, n is an integer of value from 3 to 100,000, m is 1 or 2, p and q are integers of value from 0 to 4, p+q>0, the absorbance of said polymer at 365 nm is no more than 0.1 per 1 μm of film thickness, and wherein said polymer comprises structural units according to general formula (1) where $R^3$ is a single hydrogen atom and structural units according to general formula (1) where $R^3$ is a monovalent organic group having from 1 to 10 carbon atoms, such that the total carboxyl groups contained in said polymer is from 0.02 to 2.0 mmol/g.

2. A positive-working photosensitive resin precursor composition according to claim 1 which is characterized in that the photoacid generator is a quinone diazide compound.

3. A positive-working photosensitive resin precursor composition according to claim 1 which is characterized in that some of the carboxyl groups of the polymer represented by general formula (1) are imidized by reaction with an adjacent amide group, and the percentage such imidization is from 1% to 50%.

4. A positive-working photosensitive resin precursor composition according to claim 1 which is characterized in that $R^1(COOR^3)_m(OH)_p$ in general formula (1) is represented by the following general formula (6)

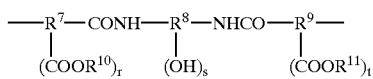

(6)

wherein $R^7$ and $R^8$ represent $C_2$ to $C_{20}$ organic groups of valency 3 or 4, $R^8$ represents a hydroxyl group-containing $C_3$ to $C_{20}$ organic group of valency 3 to 6, and $R_{10}$ and $R_{11}$ each represent hydrogen or a $C_1$ to $C_{10}$ monovalent organic group, such that $R_{10}$ and $R_{11}$ are selected so that the total carboxyl groups contained in said polymer is from 0.02 to 2.0 mmol/g, and r and t represent the integers 1 or 2, and s denotes an integer of value from 1 to 4.

5. A positive-working photosensitive resin precursor composition according to claim 1 which is characterized in that $R^2(OH)_q$ in general formula (1) is represented by the following general formula (7).

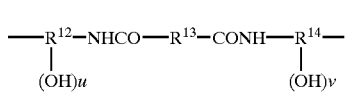

(7)

($R^{12}$ and $R^{14}$ represent hydroxyl group-containing $C_2$ to $C_{20}$ organic groups of valency 3 or 4, and $R^{13}$ represents a $C_2$ to $C_{30}$ divalent organic group. u and v represent the integer 1 or 2).

6. A positive-working photosensitive resin precursor composition according to claim 1 which is characterized in that $R^2(OH)_q$ in general formula (1) is represented by the following general formula (8).

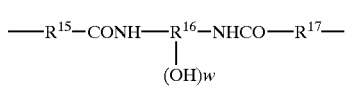

(8)

($R^{15}$ and $R^{17}$ represent $C_2$ to $C_{30}$ divalent organic groups, and $R^{16}$ represents a hydroxyl group-containing $C_2$ to $C_{20}$ organic group of valency from 3 to 6. w represents an integer in the range from 1 to 4).

7. A positive-working photosensitive resin precursor composition according to claim 1 which is characterized in that $R^2(OH)_q$ in general formula (1) is represented by general formula (9).

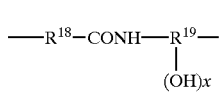

(9)

($R^{16}$ represents a $C_2$ to $C_{30}$ divalent organic group, and $R^{19}$ represents a hydroxyl group-containing $C_2$ to C20 organic group of valency from 3 to 6. x represents an integer in the range from 1 to 4).

8. A positive-working photosensitive resin precursor composition according to claim 1 which is characterized in that, in the polymer represented by general formula (1), at least 50% of $R^1(COOR^3)_m(OH)_p$ are groups represented by general formula (6), and the group represented by $R^2$ is a divalent diamine compound residual group which does not contain a hydroxyl group.

9. A positive-working photosensitive resin precursor composition according to claim 1 which is characterized in that, in general formula (1), at least 50% of $R^2(OH)_q$ is a group represented by general formula (7), and the group represented by $R^1$ is a tetracarboxylic acid residual group.

10. A positive-working photosensitive resin precursor composition according to claim 1 which is characterized in that, in general formula (1), at least 50% of $R^2(OH)_q$ is a group represented by general formula (8), and the group represented by $R^1$ is a tetracarboxylic acid residual group.

11. A positive-working photosensitive resin precursor composition according to claim 1 which is characterized in that, in general formula (1), at least 50% of $R^2(OH)_q$ is a group represented by general formula (9), and the group represented by $R^1$ is a tetracarboxylic acid residual group.

12. A method of producing a positive-working photosensitive resin precursor composition according to claim 1 which is characterized in that the compound represented by general formula (1) is produced by treating polymer in which structural units represented by general formula (2) are the chief component with at least one type of compound represented by general formulae (3), (4) or (5).

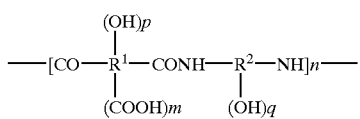
(2)

(R¹ is an organic group of valency from 3 to 8 having at least 2 carbon atoms, and R² is an organic group of valency from 2 to 6 having at least 2 carbon atoms. n is an integer of value from 3 to 100,000, m is 1 or 2, p and q are integers of value from 0 to 4 and p+q>0).

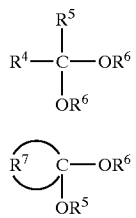
(3)

(4)

(5)

($R^4$ and $R^5$ represent a hydrogen atom or a monovalent organic group, nitrogen-containing organic group or oxygen-containing organic group with at least one carbon atom. $R^6$ represents a monovalent organic group with at least one carbon. $R^7$ represents a divalent organic group, nitrogen-containing group or oxygen-containing organic group with at least one carbon atom).

13. A method of producing a positive-working photosensitive resin precursor composition according to claim 12 which is characterized in that the compound represented by general formula (3) is an N,N-dimethylformamide dialkyl acetal.

14. A method of producing a positive-working photosensitive resin precursor composition according to claim 12 which is characterized in that the compound represented by general formula (5) is cyclohexyl vinyl ether.

* * * * *